(12) United States Patent
Huang

(10) Patent No.: US 7,126,379 B2
(45) Date of Patent: Oct. 24, 2006

(54) OUTPUT DEVICE FOR STATIC RANDOM ACCESS MEMORY

(75) Inventor: Chao-Sheng Huang, Taipei (TW)

(73) Assignee: VIA Technologies, Inc., Taipei (TW)

( * ) Notice: Subject to any disclaimer, the term of this patent is extended or adjusted under 35 U.S.C. 154(b) by 60 days.

(21) Appl. No.: 10/866,748

(22) Filed: Jun. 15, 2004

(65) Prior Publication Data

US 2005/0068064 A1    Mar. 31, 2005

(30) Foreign Application Priority Data

Sep. 26, 2003   (TW) .............................. 92126761 A

(51) Int. Cl.
H03K 19/00    (2006.01)
H03K 19/096   (2006.01)
G11C 11/34    (2006.01)
G11C 16/04    (2006.01)

(52) U.S. Cl. ........................... 326/93; 326/95; 326/97; 326/112; 365/185

(58) Field of Classification Search ................. 326/93, 326/83, 128, 119, 121, 112; 365/154, 156, 365/189–225, 185.05, 185.25, 185
See application file for complete search history.

(56) References Cited

U.S. PATENT DOCUMENTS

| | | | |
|---|---|---|---|
| 6,060,909 A * | 5/2000 | Aipperspach et al. | 326/98 |
| 6,246,266 B1 * | 6/2001 | Bosshart | 326/98 |
| 6,275,442 B1 * | 8/2001 | Hill et al. | 365/230.06 |
| 6,674,671 B1 * | 1/2004 | Campbell et al. | 365/189.05 |
| 6,900,666 B1 * | 5/2005 | Kursun et al. | 326/95 |
| 6,919,739 B1 * | 7/2005 | Ngo | 326/98 |

* cited by examiner

Primary Examiner—Rexford Barnie
Assistant Examiner—Dylan White
(74) Attorney, Agent, or Firm—Bacon & Thomas, PLLC

(57) ABSTRACT

An output device for static random access memory is disclosed, which has a precharger, a charge and discharge path circuit, a voltage hold circuit and an output inverter. The precharger connects to a common output node of a plurality of memory cells. When one of the memory cells is to be read, the common output node is precharged to a high potential. The charge and discharge path circuit connects to the common output node and controls an output voltage on its output node in accordance with an internal first grounding path on or not. The voltage hold circuit connects to both the output node of the path circuit and the common output node and controls a voltage of the common output node in accordance with both the output voltage of the path circuit and an internal second grounding path. When the precharger is precharging, the second grounding path is disconnected.

8 Claims, 4 Drawing Sheets

OUTPUT DEVICE FOR STATIC RANDOM ACCESS MEMORY

BACKGROUND OF THE INVENTION

1. Field of the Invention

The present invention relates to the technical field of static random access memory (SRAM) and, more particularly, to an output device for static random access memory.

2. Description of Related Art

FIG. 1 is a schematic diagram of a typical SRAM and the output device thereof. As shown, for illustrative purpose, only one memory cell 100 is described, while others are schematically represented by dotted lines. The memory cell 100 consists of a plurality of metal oxide semiconductor (MOS) transistors and its output end has an N-type metal oxide semiconductor (NMOS) transistor MR. The transistor MR has a drain connected to a node E of an output device 120, a gate connected to a control signal RWL (read word line) in order to control data of the memory cell 100 to be sent to the node E or not. The output device 120 consists of P-type metal oxide semiconductor (PMOS) transistors 101, 103, 105 and 107 and NMOS transistors 102, 104 and 106.

FIG. 2 shows a timing diagram of the output device 120. As shown in FIG. 2, when data of the memory cell is to be read, the node E of the output device 120 maintains at high potential for a pre-charging process. Accordingly, in T1 interval, control signals PRE and RWL are at low potential, the transistor MR is in off state, and the transistor 101 is turned on such that a source of the transistor 101 connects to a voltage Vdd in order to precharge the node E and further maintain the node E at high potential. Next, in T2 interval, the potential of the control signal PRE changes from low to high, which represents that the pre-charge on the node E is complete. Then, in the T3 interval, the potential of the control signal RWL changes from low to high, which turns on NMOS transistor MR. It represents that data of the memory cell 100 is sending to the output device 120. Next, after T3 interval, when data of the memory cell 100 is in high potential, a node F of the memory cell 100 is in low potential, such that the transistor MP of the memory cell 100 is in off state. At this point, the node E maintains at high potential due to the pre-charge. Therefore, the NMOS transistor 102 is turned on such that a node G is at low potential. Next, in the output device 120, a high potential (the same high potential as data of the memory 100) on a node OUT is outputted through an inverter 122 consisting of MOS transistors 106 and 107. On the other hand, when data of the memory 100 sent is in low potential, the node F of the memory cell 100 is in high potential, and the transistor MP of the memory cell 100 is turned on. At this point, a source of the transistor MP is in a potential GND and it pulls down the potential on the node E. Thus, the potential on the node E changes from high to low. Meanwhile, the PMOS transistor 103 is turned on such that the node G is at high potential. It induces a low potential (the same low potential as data of the memory cell 100) on the node OUT, which is outputted through the inverter 122 consisting of MOS transistors 106 and 107. However, as cited, the node E connects to multiple memory cells so that the load of the node E is higher (indicated by a capacitor 108) and when a potential of the node E changes from high to low, it needs more time to pull the potential down. This is why changing the node G to high potential requires a long duration, which wastes time. Besides, the NMOS transistor 102 needs to be in the turn-on state as node E is in high potential, it will postpone the transistor 103 to pull the node G to high potential. Thus the node G maintains at low potential when receiving the source potential of the MOS transistor 102, which causes the PMOS transistor 105 turned on. Therefore, a voltage Vdd is provided to the node E through a source of the PMOS transistor 105, so that the potential of the node E cannot quickly change from high to low and it wastes a long duration. Accordingly, a long switching time is required when data of the memory cell 100 sent is low potential.

Further, when a previous memory cell is read as low potential, the node E is at low potential. Since the PMOS transistor 103 is turned on when the node E is low potential, its source voltage is provided to the node G so as to turn on the NMOS transistor 104. Therefore, a voltage GND is provided to the node E through a source of the transistor 104. When a pre-charging is performed in T1 interval, the node E is charged by the source voltage Vdd of the transistor 101 to high potential. The transistors 101, 104 function as shown in FIG. 3. The transistor 104 maintains the node E at low potential, and conversely the transistor 101 maintains the node E at high potential. Accordingly, a very small size is applied to the transistor 104 in design, which is much smaller than that to the transistor 101, thereby obtaining a higher driving force to achieve the precharge to the node E.

However, by contrast, the very small transistor 104 has poorer driving capability. This may affect transmitting data of the memory cell 100 with low potential because when the node G changes to high potential after a certain time waste and thus the NMOS transistor 104 is turned on to provide the node E with its source voltage GND. The effect of speeding the node E down to a low voltage is relatively reduced due to the cited poorer driving force. Thus, read speed of the memory cell cannot be increased.

Therefore, it is desirable to provide an improved output device for SRAM to mitigate and/or obviate the aforementioned problems.

SUMMARY OF THE INVENTION

The object of the present invention is to provide an output device for static random access memory (SRAM), which can speed up potential transition on nodes of the output device and further increase read speed of the memory.

To achieve the object, the output device of the present invention essentially includes a precharger, a charge and discharge path circuit, a voltage hold circuit and an output inverter. The precharger has a common output node connected to output nodes of a plurality of memory cells. When one of the memory cells is to be read, the common output node is precharged to a high potential. The charge and discharge path circuit connects to the common output node and controls an output voltage on its output node in accordance with an internal first grounding path on or not. The voltage hold circuit connects to both the output node of the path circuit and the common output node of the precharger and controls a voltage of the common output node in accordance with both the output voltage of the path circuit and an internal second grounding path. When the precharger is precharging, the second grounding path is disconnected. The output inverter generates a phase inverse voltage to output in accordance with an output voltage at an output node of a discharge path controller.

Other objects, advantages, and novel features of the invention will become more apparent from the following detailed description when taken in conjunction with the accompanying drawings.

DETAILED DESCRIPTION OF THE PREFERRED EMBODIMENT

Figure 4:
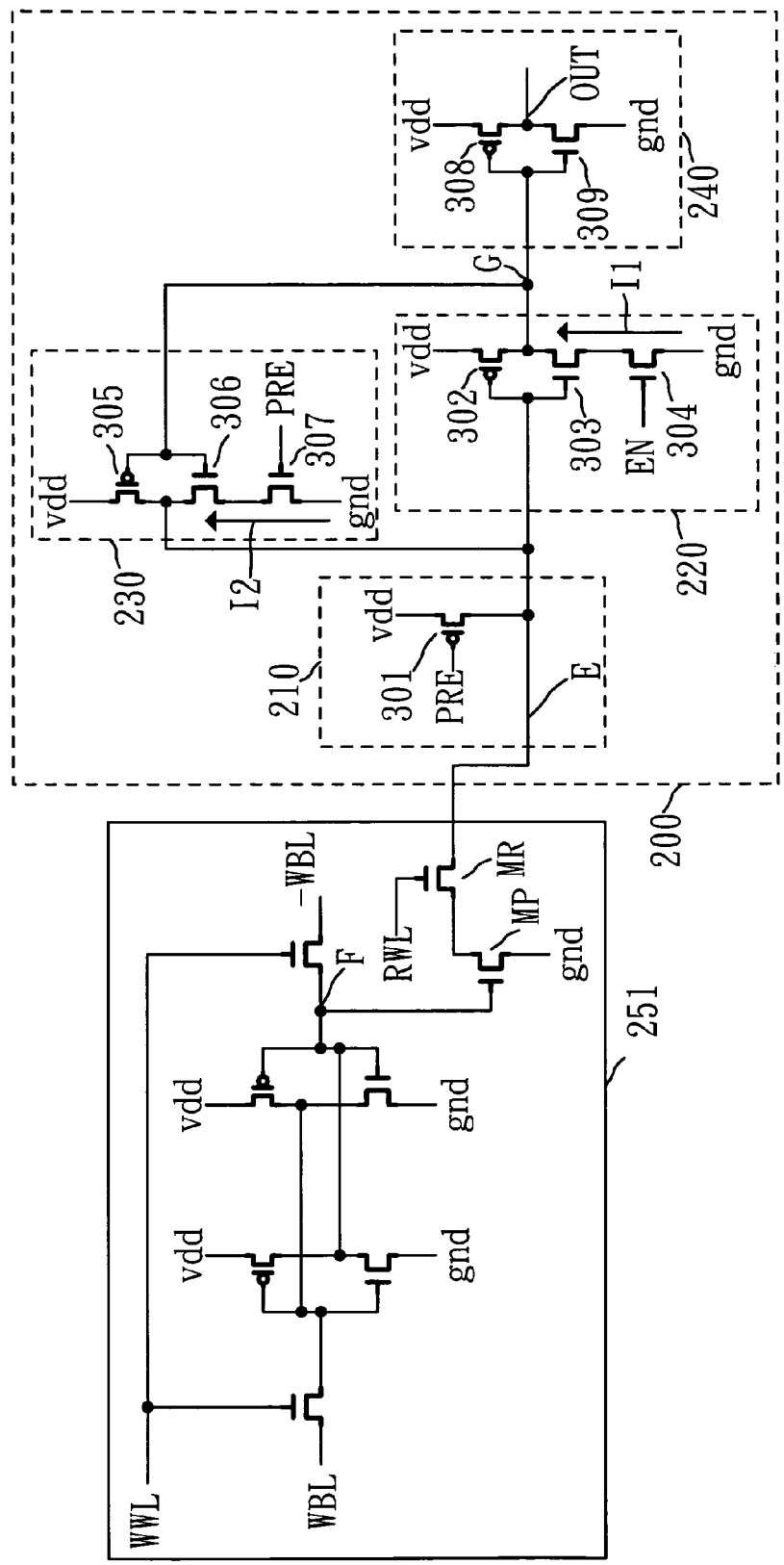
FIG. 4 is a detail circuit of an output device for SRAM in accordance with the invention.

FIG. 4 shows a preferred embodiment of a detail circuit of an output device for SRAM in accordance with the invention, wherein multiple memory cells are connected to a node E, whereas only one memory cell 251 is shown for illustrative purpose. In FIG. 4, the output device 200 includes a precharger 210, a charge and discharge path circuit 220, a voltage hold circuit 230 and an output inverter 240. As shown, the precharger 210 is a PMOS transistor 301 to precharge the node E to a high potential before accessing the memory cell 251 for data transfer. The output inverter 240 consists of PMOS transistor 308 and NMOS transistor 309, which function identically to the prior art and thus a detailed description is deemed unnecessary. The output device for SRAM is characterized in the charge and discharge path circuit 220 and the voltage hold circuit 230. The charge and discharge path circuit 220 consists of PMOS transistor 302 and NMOS transistors 303, 304. The transistor 302 has a gate connected to both the node E and a gate of the transistor 303, a source connected to a high potential Vdd, and a drain connected to a drain of the transistor 303. The transistor 303 has a source connected to a drain of the transistor 304. The transistor 304 has a source connected to a low potential (such as a ground voltage GND) and a gate connected to an enable signal EN. As compared with the prior art, the NMOS transistor 304 is added and the enable signal EN is added to control the NMOS transistor 304 on and off for further controlling a grounding path I1 active and inactive. Thus, a potential on a node G can completely be controlled by the transistor 302, avoiding the prior problem that the node E cannot quickly changed from a high potential to a low potential.

The voltage hold circuit 230 consists of PMOS transistor 305 and NMOS transistors 306, 307. The transistor 305 has a gate connected to drains of the transistors 302 and 303 and a gate of the transistor 306, a source connected to a high potential Vdd, and a drain connected to a drain of the transistor 306 and the node E. The transistor 306 has a source connected to a drain of the transistor 307. The transistor 307 has a source connected to a low potential (such as a ground voltage GND) and a gate connected to a precharge signal PRE that controls the PMOS transistor 301 of the precharger 210. The voltage hold circuit 230 adds an NMOS transistor 307 and using the precharge signal PRE to control the NMOS transistor 307 on and off for further controlling another grounding path I2 active (to impact on a potential of the node E). Due to the inherent difference between a PMOS and an NMOS, the PMOS transistor 301 or the NMOS transistor 307 can not be active both as receiving the same signal. Therefore, interference between the transistors 301 and 307 will not occur and the size design for transistors (such as, in this case, transistors 306, 307) of the voltage hold circuit 230 can be enlarged to enhance the driving force and speed the feedback transition.

Figure 5:
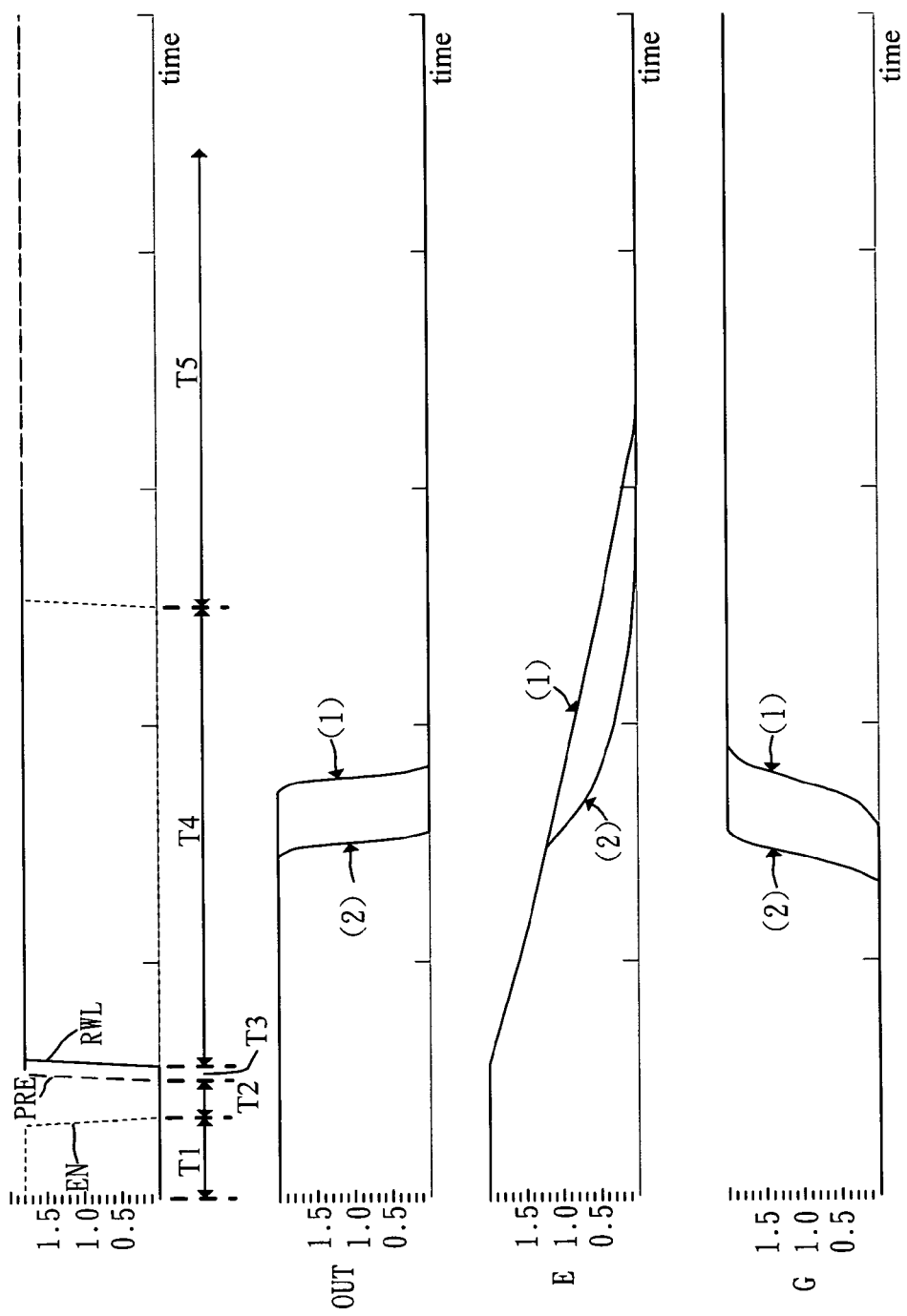
FIG. 5 is a timing diagram of FIG. 4.

Next, a read timing diagram of FIG. 4 is described in FIG. 5 as an operation example of the output device 200. The output device 200 can be operable at an input voltage ranging between 0–1.8V, for example. As shown in FIG. 5, in T1 and T2 intervals, the output device 200 is in pre-charging. Meanwhile, the enable signal EN changes from high potential to low potential as T1 interval changes to T2 interval, so as to disconnect the grounding path I1 of the transistor 303 for controlling the potential of the node G, which is active in a T4 interval and described hereinafter.

Figure 1:
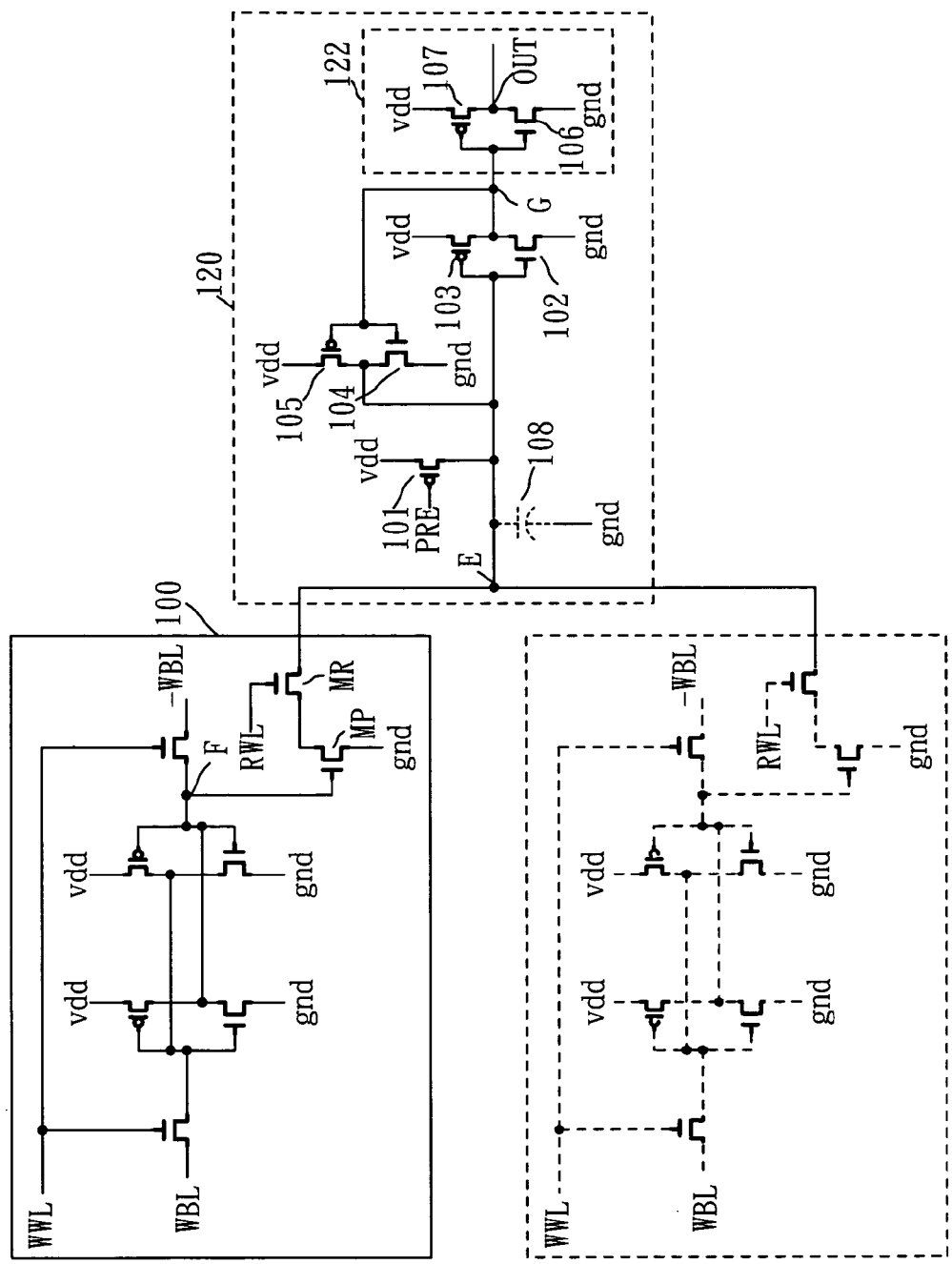
FIG. 1 is a schematic diagram of a conventional SRAM and the output device thereof.
Figure 2:
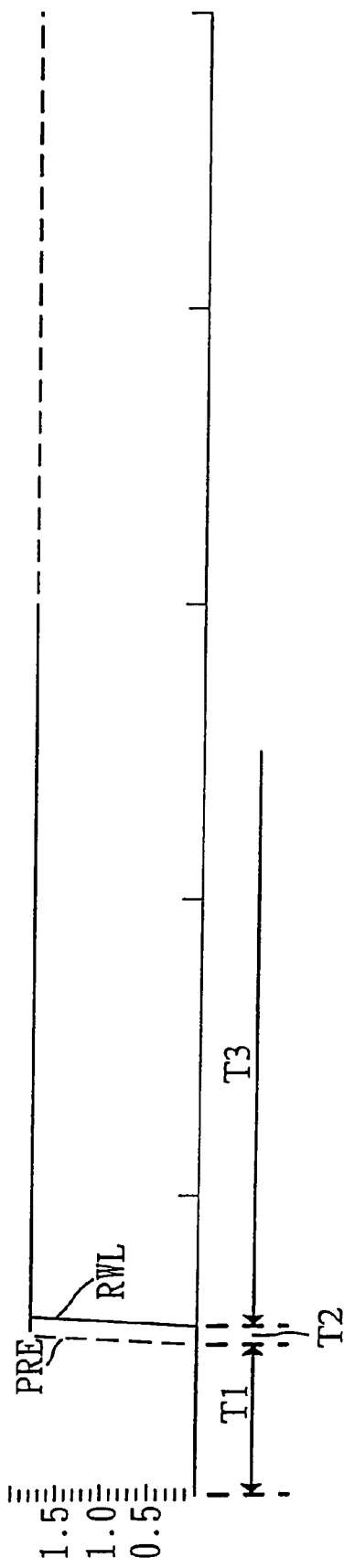
FIG. 2 is a timing diagram of the output device of FIG. 1.
Figure 3:
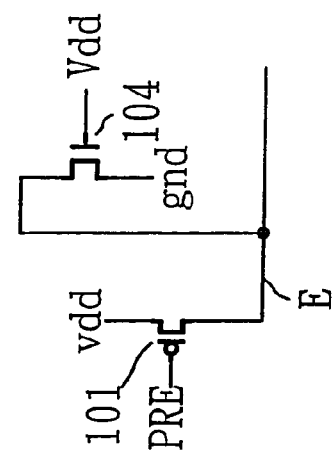
FIG. 3 is an equivalent schematic diagram of FIG. 1.

In T1 and T2 intervals, the pre-charge signal PRE is in low potential such that the PMOS transistor 301 is turned on and its source voltage Vdd pre-charges the node E to a high potential. If the node E is in low potential before pre-charged, at this point, the PMOS transistor 302 is turned on and thus its source voltage Vdd is provided to the node G to turn on the NMOS transistor 306. In this case, the NMOS transistor 307 cannot be turned on due to the low potential of the pre-charge signal PRE, and thus the grounding path I2 is blocked (disconnected). As cited, interaction between two transistors of FIG. 3 (i.e., transistors 301 and 306 in this embodiment) to the node E does not occur and thus the size limit of the transistor 306 smaller than the transistor 301 is not required and accordingly the driving capability of the transistor 306 is enhanced. This is shown in T4 interval.

In T3 interval, the pre-charge signal PRE changes from low potential to high potential, which represents that the pre-charge on the node E to a high potential is complete. Next, in T4 interval, the control signal RWL changes from low potential to high potential and the NMOS transistor MR is turned on, which represents that data of the memory cell 251 starts sending to the output device 200.

When data stored in the memory cell 251 is at high potential (not shown), the node F is at low potential, the transistors MR, 305 and 307 are turned on, and the transistors MP, 301, 302, 304 and 306 are turned off. At this point, the node E retains high potential precharged, and the node G retains low potential through the grounding path provided by turning on the NMOS transistor 304 due to the enable signal EN with high potential in T1 interval. Finally, the node G with low potential is changed by the inverter 204 such that the node OUT outputs a high potential.

Conversely, when data stored in the memory cell 251 is low potential (i.e., the node E from high potential to low potential in FIG. 5), the node F is high potential, and the transistors MR, MP are turned on. Because the enable signal EN changes from high potential to low potential as T1 interval changes to T2 interval, the grounding path I1 consisting of the transistors 303 and 304 are disconnected. Thus, the voltage on the node G cannot be maintained at low potential (at this point, the transistor 302 is turned on and starts providing the node G with high potential), which causes the PMOS transistor 305 turned on for providing the node E with high potential and thus the speed of changing from high potential to low potential on the node E is reduced. However, by contrast, the transistor 302 provides the node G with high potential such that the transistor 306 is turned on and further the NMOS transistor is turned on when combining the transistor 306 active and the precharge signal PRE with high potential. As cited, sizes of the transistors 306 and 307 cannot be limited by a size of the PMOS 301 and thus a configuration with higher driving force can be designed. Accordingly, a graph of FIG. 5 shows the voltage change on the node E in a curve change from curve (1) to curve (2), which illustrates that curve (2) has shorter switching time than curve (1) as comparing G and OUT voltage change under the node E active.

Finally, in an appropriate time such as T5 interval, the enable signal EN is changed from low potential to high potential. If the node E is low potential, the NMOS transistor 303 is inactive and thus data transfer is not affected. On the other hand, if the node E goes to a high potential, the grounding path I1 is provided to avoid floating the node G after a certain interval.

As cited, in T1 interval, because the NMOS transistor is added in the voltage hold circuit, which has active time different from the precharger, and thus no interference occurs. Therefore, the precharger can precharge the node E to a high potential quickly. In T4 interval, the NMOS transistor of the charge and discharge path circuit turns the grounding path off and the voltage hold circuit can be designed as large-size transistor driving to speed up the node E to a low potential and increase read speed of the memory cell.

Although the present invention has been explained in relation to its preferred embodiment, it is to be understood that many other possible modifications and variations can be made without departing from the spirit and scope of the invention as hereinafter claimed.

What is claimed is:

1. An output device for a static random access memory (SRAM), the SRAM having a plurality of memory cells to store data, the output device comprising:
   a precharger, having a common output node connected to output nodes of a plurality of memory cells, precharging the common output node to a high potential when one of the memory cells is to be read;
   a charge and discharge path circuit connected to the common output node, controlling a path output voltage on a path output node of the charge and discharge path circuit in accordance with whether an internal first grounding path is on or not;
   a voltage hold circuit connected to the path output node and the common output node, controlling a voltage of the common output node in accordance with the path output voltage and an internal second grounding path and disconnecting the second grounding path if the precharger is precharging and
   an output inverter, generating a phase inverse voltage to output in accordance with the path output voltages,
   wherein the pre-charger and the voltage hold circuit are commonly connected to a signal that simultaneously causes the pre-charger to precharge said common output node to a high potential and to disconnect said internal second grounding path, and
   wherein the internal first grounding path includes first and second transistors having control electrodes connected to the common output node for connecting said output path node to respective first and second voltages, and a third transistor connected between said first transistor and said second voltage and controlled by an enable signal to further control connection of the output path node to said second voltage.

2. The output device as claimed in claim 1, wherein the precharger is a first PMOS transistor to precharge the common output node to a high potential when the first PMOs transistor is turned on for one of the memory cells to be read.

3. The output device as claimed in claim 1, wherein the charge and discharge path circuit includes a second PMOS transistor, a first NMOS transistor and a second NMOS transistor connected in series, and the first grounding path consists of the first NMOS transistor and the second NMOS transistor.

4. The output device as claimed in claim 3, further comprising an enable signal to control the second NMOS transistor and thus determine if the first grounding path is active.

5. An output device for a static random access memory (SRAM), the SRAM having a plurality of memory cells to store data, the output device comprising:
   a precharger, having a common output node connected to output nodes of a plurality of memory cells, precharging the common output node to a high potential when one of the memory cells is to be read;
   a charge and discharge path circuit connected to the common output node, controlling a path output voltage on a path output node of the charge and discharge path circuit in accordance with whether an internal first grounding path is on or not;
   a voltage hold circuit connected to the path output node and the common output node, controlling a voltage of the common output node in accordance with the path output voltage and an internal second grounding path and disconnecting the second grounding path if the precharger is precharging and
   an output inverter, generating a phase inverse voltage to output in accordance with the path output voltage,
   wherein the voltage hold circuit includes a third PMOS transistor, a third NMOS transistor and a fourth NMOS transistor connected in series, and the second grounding path consists of the third NMOS transistor and the fourth NMOS transistor.

6. The output device as claimed in claim 5, further comprising a control signal to control the fourth NMOS transistor and thus determine if the second grounding path is active.

7. The output device as claimed in claim 6, wherein the control signal is used to control the first PMOS transistor for a control of precharging the common output node to a high potential.

8. An output device for a static random access memory (SRAM), the SRAM having a plurality of memory cells to store data, the output device comprising:
   a precharger, having a common output node connected to output nodes of a plurality of memory cells, precharging the common output node to a high potential when one of the memory cells is to be read;
   a charge and discharge path circuit connected to the common output node, controlling a path output voltage on a path output node of the charge and discharge path circuit in accordance with whether an internal first grounding path is on or not;
   a voltage hold circuit connected to the path output node and the common output node, controlling a voltage of the common output node in accordance with the path output voltage and an internal second grounding path and disconnecting the second grounding path if the precharger is precharging and
   an output inverter, generating a phase inverse voltage to output in accordance with the path output voltage, wherein the output inverter includes a fourth PMOS transistor and a fifth NMOS transistor connected in series, which outputs a phase inverse voltage in accordance with the path output voltage.

* * * * *